US012800117B2

(12) United States Patent
Poon (Pan)

(10) Patent No.: US 12,800,117 B2
(45) Date of Patent: Nov. 17, 2026

(54) PCB ELECTROPLATING AND ELECTRICAL CONNECTION BOX STRUCTURE AND MODULAR LUMINAIRE

(71) Applicant: Chi Wai Patrick Poon, Hong Kong (CN)

(72) Inventor: Chi Wai (Zhiwei) Patrick Poon (Pan), Guangzhou City (CN)

( * ) Notice: Subject to any disclaimer, the term of this patent is extended or adjusted under 35 U.S.C. 154(b) by 0 days.

(21) Appl. No.: 15/539,883

(22) PCT Filed: Jul. 22, 2016

(86) PCT No.: PCT/CN2016/090987
§ 371 (c)(1),
(2) Date: Jun. 26, 2017

(87) PCT Pub. No.: WO2017/020732
PCT Pub. Date: Feb. 9, 2017

(65) Prior Publication Data

US 2018/0156397 A1 Jun. 7, 2018

(30) Foreign Application Priority Data

Jul. 31, 2015 (CN) ......................... 201520575047.0
Jul. 31, 2015 (CN) ......................... 201520575049.X
May 13, 2016 (CN) ......................... 201620442343.8

(51) Int. Cl.
*F21S 2/00* (2016.01)
*F21S 9/02* (2006.01)
(Continued)

(52) U.S. Cl.
CPC ................. *F21S 2/005* (2013.01); *F21S 2/00* (2013.01); *F21S 9/02* (2013.01); *F21V 17/12* (2013.01);
(Continued)

(58) Field of Classification Search
CPC ..... F21S 2/005; F21S 2/00; F21S 9/02; F21V 17/12; F21V 19/0025; F21V 21/096; F21V 23/04
See application file for complete search history.

(56) References Cited

U.S. PATENT DOCUMENTS 7,080,927 B2 * 7/2006 Feuerborn ............... F21S 2/005
362/249.14
7,355,562 B2 * 4/2008 Schubert ................... G09F 9/33
345/905

(Continued)

*Primary Examiner* — Abdulmajeed Aziz
*Assistant Examiner* — Jessica M Apenteng

(57) ABSTRACT

The present invention relates to an electrical connection structure for a PCB and an electroplating frame, and a modular lamp. The modular lamp comprises a plurality of light-emitting modules. Each light-emitting module comprises a housing and a lamp plate arranged within the housing, a light source and conductive connectors electrically connected to the light source being arranged on the lamp plate, an outer side wall of the housing being provided with two sets of conductive strips surrounding the outer side wall and protruding from the outer side wall, the two sets of conductive strips being respectively electrically connected to two electrodes of the lamp plate via the conductive connectors. After the plurality of light-emitting modules have been assembled and joined together, adjacent light-emitting modules are in contact and electrically connected via the conductive strips. The modular lamp is provided with the plurality of light-emitting modules, the shapes of the light-emitting modules are flexible and variable, each module is designed independently, and after the light-emitting modules have been joined together, adjacent light-emitting modules are electrically connected via the conductive strips on the outer side walls and may be combined to form a variety of shapes. The present invention is simple in operation, and strong in combination operability.

29 Claims, 11 Drawing Sheets

(51) Int. Cl.

| | |
|---|---|
| ***F21V 17/12*** | (2006.01) |
| ***F21V 19/00*** | (2006.01) |
| ***F21V 21/096*** | (2006.01) |
| ***F21V 23/04*** | (2006.01) |
| ***F21V 23/06*** | (2006.01) |
| ***F21Y 115/10*** | (2016.01) |
| ***H05K 1/18*** | (2026.01) |

(52) U.S. Cl.

CPC ........ *F21V 19/0025* (2013.01); *F21V 21/096* (2013.01); *F21V 23/04* (2013.01); *F21V 23/06* (2013.01); *H05K 1/18* (2013.01); *F21Y 2115/10* (2016.08); *H05K 2201/032* (2013.01); *H05K 2201/10106* (2013.01); *H05K 2201/10113* (2013.01)

(56) References Cited

U.S. PATENT DOCUMENTS

| | | | | | |
|---|---|---|---|---|---|
| 7,897,980 | B2 * | 3/2011 | Yuan | F21K 9/00 313/500 |
| 2009/0237936 | A1 * | 9/2009 | Ku | F21V 21/005 362/249.14 |
| 2011/0013406 | A1 * | 1/2011 | Kuo | H05K 1/142 362/382 |
| 2012/0224373 | A1 * | 9/2012 | Snijder | F21S 2/005 362/249.01 |

* cited by examiner

PCB ELECTROPLATING AND ELECTRICAL CONNECTION BOX STRUCTURE AND MODULAR LUMINAIRE

RELATED APPLICATION

This application is the US national phase of International Application Number PCT/CN2016/090987, Filed on 22 Jul. 2016, which designated the U.S. and which claims benefit of CN201520575049.X filed 31 Jul. 2015, the entire content of which is hereby incorporated by reference.

FIELD OF THE INVENTION

The present invention relates to lamps and lanterns field, especially electrical connection structure for a PCB and an electroplating frame, and a modular lamp.

BACKGROUND OF THE INVENTION

The modular lamp is popular among masses of customers for its features of self-assembly shapes. The connection between electroplating frame of traditional modular lamp and PCB usually adopts bonding wire on energizing platinum-copper of PCB and fixing screw into boss of electroplating frame, which is inefficient in assembly, costly and not easy to assemble, and the bonding wire blocks partial light effecting light effect.

SUMMARY OF THE INVENTION

In view of this, it's necessary to provide a kind of modular lamp featuring free shaping and simple operation. A kind of modular lamp comprises a plurality of light-emitting modules. Each light-emitting module comprises a housing and a lamp plate arranged within the housing, a light source and conductive connectors electrically connected to the light source being arranged on the lamp plate, an outer side wall of the housing being provided with two sets of conductive strips surrounding the outer side wall and protruding from the outer side wall, the two sets of conductive strips being respectively electrically connected to two electrodes of the lamp plate via the conductive connectors. After the plurality of light-emitting modules have been assembled and joined together, adjacent light-emitting modules are in contact and electrically connected via the conductive strips.

In one of the implementations, each set of conductive strip forms conductive band on outer side wall of the housing through continuous setting.

In one of the implementations, each set of conductive strip contains some sub-conductive strips and there is insulation gap between adjacent sub-conductive strips of each set of conductive strip, the length of insulation gap is greater than width of the sub-conductive strips, and the length of sub-conductive strips is not more than the distance between two sets of the conductive strips.

In one of the implementations, the length of sub-conductive strips is not less than the length of insulation gap, and the length of sub-conductive strips less than the distance between two sets of the conductive strips, the two sets of the conductive strips is set in parallel on the outer side wall, and the position of sub-conductive strips among the two sets of conductive strips is oppose to that of the insulation gap.

In one of the implementations, the conductive strips protrude from the surface of outer side wall.

The sub-conductive strips surrounding the outer side wall are set with anti-short-circuiting strips covering the insulation gap, and the sub-conductive strips protrude from the anti-short-circuiting strips.

In one of the implementations, the conductive strips protrude from the surface of outer side wall.

The housing is set with two sets of support strips protruding the surface of the housing between the two sets of conductive strips, each support strip contains several sub-support strips and there is support gap between adjacent sub-support strips of each set of support strips, the position of support gap is opposed to that of sub-support strips and of support gap between sub-conductive strips of adjacent conductive strips of the support strips and their support strips, as well as that of insulation gap and the sub-support strips.

In one of the implementations, the light-emitting modules come in many shapes, and each light-emitting module contains four square sub-modules in a same plane. The connecting sides of adjacent two sub-modules of light-emitting module overlap.

In one of the implementations, in the conductive strips formed by alternate setting of a plurality of sub-conductive strips and insulation gap, the length of sub-conductive strips and insulation gap equal the half of length of side of sub-module respectively.

In one of the implementations, the two sides of corner position of the outer side wall of the housing are the sub-conductive strips and insulation gap respectively, and the positions of sub-conductive strips and insulation gap in the two sides of the corner position are set symmetrically with the corner. The position of the sub-conductive strips is opposed to that of insulation position.

In one of the implementations, the housing contains base plate, first conductive plywood, main frame, second conductive plywood and roof, which are successively connected to the housing. The base plate, first conductive plywood, main frame, second conductive plywood and roof together make the housing with holding cavity, the outer side walls of the first conductive plywood and the second conductive plywood contain the conductive strips, and lamp plate is set in the holding cavity.

In one of the implementations, the surface of non-outer side wall area of the first conductive plywood and the second conductive plywood is set with conducting layer, the conducting layer electrically connects with conductive connections of the lamp plate, and the conductive strips electrically connect with the conductive layer.

In one of the implementations, the conductive strips and the corresponding conductive layer is molded in one coating structure.

In one of the implementations, the first conductive plywood and the second conductive plywood are equipped with matched limit sockets, and at least one inner side wall of the limit sockets is zigzag structure. The two ends of lamp plate insert into the limit sockets, and the conductive connections of two ends of lamp plate contact with inner wall of zigzag structure to form electric connection.

In one of the implementations, the conductive connections of two ends of lamp plate are metal foils set on the lamp plate.

In one of the implementations, there is at least one main module in a plurality of light-emitting modules, the main module contains main circuit board, and the main circuit board contains conductive connections. The conductive connections of lamp plate corresponding electrically connect with that of main circuit board.

The first conductive plywood and the second conductive plywood of the main module are set with matched slots. The main circuit board is set in the slots and the conductive connections of two ends of main circuit board contact with inner wall of slots to form electric connection.

In one of the implementations, the lamp plate of main module is molded in one with main circuit board, and the lamp plate and main circuit board share the conductive connections.

In one of the implementations, the conductive connections of main circuit board are metal foils set on main circuit board.

In one of the implementations, the main circuit board is set with press switch and/or toggle switch controlling electricity of light source.

In one of the implementations, the housing is set with rechargeable power supply. The rechargeable power supply electrically connects with main circuit board, and the main circuit board is set with charge ports.

In one of the implementations, the base plate and the roof are inwards set with matched erection columns. The base plate permanently connects with the roof through matched screws of the erection columns and makes the first conductive plywood, main frame and the second conductive plywood in the center.

In one of the implementations, the base plate, main frame and roof are together set with magnetic field, and the magnetic field is set with magnetic.

A plurality of light-emitting modules can assemble and joint each other through magnetic adsorption of the magnetic.

In one of the implementations, the size of the magnetic is less than that of magnetic field to ensure the magnetic turn over freely in magnetic field.

In one of the implementations, the base plate and roof of light-emitting modules are set with trim strips, and the two ends of strips connect with conductive strips.

In one of the implementations, the trim strips are metal strips, the base plate and roof are set with anti-short circuit bone along trim strips and/or conductive strips and protruding the surface of trim strips to avoid short circuit when one trim strip of light-emitting module connects with conductive strip of another light-emitting module in jointing light-emitting modules.

The modular lamp is provided with the plurality of light-emitting modules, the shapes of the light-emitting modules are flexible and variable, each module is designed independently, and after the light-emitting modules have been joined together, adjacent light-emitting modules are electrically connected via the conductive strips on the outer side walls and may be combined to form a variety of shapes. The present invention is simple in operation, and strong in combination operability.

And, each set of conductive strip contains a plurality of sub-conductive strips, and there is insulation gap among the adjacent sub-conductive strips of each set of conductive strip. The length of the insulation gap is greater than the width of sub-conductive strips to ensure each light-emitting module can be jointed on the plate, make electric connection, and cross connect on specific position to attain 3D combination effect. The modular lamp may be combined to form a variety of shapes. The present invention is simple in operation, and strong in combination operability.

And, setting the length of sub-conductive strips no less than that of insulation gap, setting the two conductive strips on side wall in parallel and setting the position of sub-conductive strips between the two sets of conductive strips opposed to that of insulation gap to ensure there is no short circuit, there are more assembled shapes and assembly methods when the side walls of each light-emitting module joint and assemble freely.

Besides, it's necessary to provide a kind of electric connection structure for PCB and electroplating frame, which is easy to assemble and reduces cost, and modular lamp containing the electric connection structure.

A kind of electric connection structure for PCB and electroplating frame, the PCB is set with conductive connections electrically connecting with electrical elements. The outer side walls of the electroplating frame are set with conductive strips. The surface of non-outer side wall area of electroplating frame is set with conductive layer. The conductive layer electrically connects with the conductive connections, and the conductive strips electrically connect with conductive layer.

In one of the implementations, the conductive strips and the corresponding conductive layer is molded in one coating structure.

In one of the implementations, the electroplating frame is equipped with limit sockets, and at least one inner side wall of the limit sockets is zigzag structure. The PCB inserts into the limit sockets, and the conductive connections of the PCB contact with inner wall of zigzag structure to form electric connection.

In one of the implementations, the electroplating frame is set with slots. The PCB is set in the slots and the conductive connections of the PCB contact with inner wall of slots to form electric connection.

In one of the implementations, the conductive connections are metal foils setting on the PCB.

A kind of modular lamp comprises a plurality of light-emitting modules. Each light-emitting module comprises a electric connection structure of the PCB and electroplating frame in each implementation, in which, the PCB comprises lamp plate set with light source, the electroplating frame comprises the first conductive plywood and the second conductive plywood, the light-emitting module comprises base plate, main frame and roof. The base plate, first conductive plywood, main frame, second conductive plywood and roof are set successively and together make the housing with holding cavity, the outer side walls of the first conductive plywood and the second conductive plywood contain the conductive strips, and lamp plate is set in the holding cavity. After a plurality of light-emitting modules assembling and jointing, the adjacent light-emitting modules can electrically connect with each other through the conductive strips.

The outer side walls of electroplating frame are set with conductive strips, the non-outer side wall area is set with conductive layer, and the conductive layer electrically connects with conductive connections of conductive strips and PCB respectively. Comparing with traditional design fixing electroplating frame with conductive connections of PCB through screws, the connecting structure is simpler and easy to manufacture, the performance of product is more reliable and the stability is better.

DESCRIPTION OF THE DRAWINGS

FIG. 1 is structural diagram of "line" shape main module of FIG. 1;

DESCRIPTION OF A SPECIFIC IMPLEMENTATION OF THE INVENTION

In order to make the present invention clear, it will overall describe the present invention with corresponding figures. The figures present some good implementations of the present invention. But the invention can be presented in many different ways which not limit to the implementations given by this document. The purpose providing implementations is to help fully understand the public contents.

If one element is "fixed" to another element, it can be fixed on the element or it is a centered element. If one element "connects" with another element, it can connect to the element or it is a centered element.

Otherwise other definitions, the meaning of technology and scientific terms in this document is same to that of understanding of technician in technology field of the present invention. The terms used in instruction of the invention in this document are only for describing specific implementations, but not limited to the invention. The term "and/or" means one or more than one arbitrary and all combination of the project.

Embodiment 1

Figure 1:
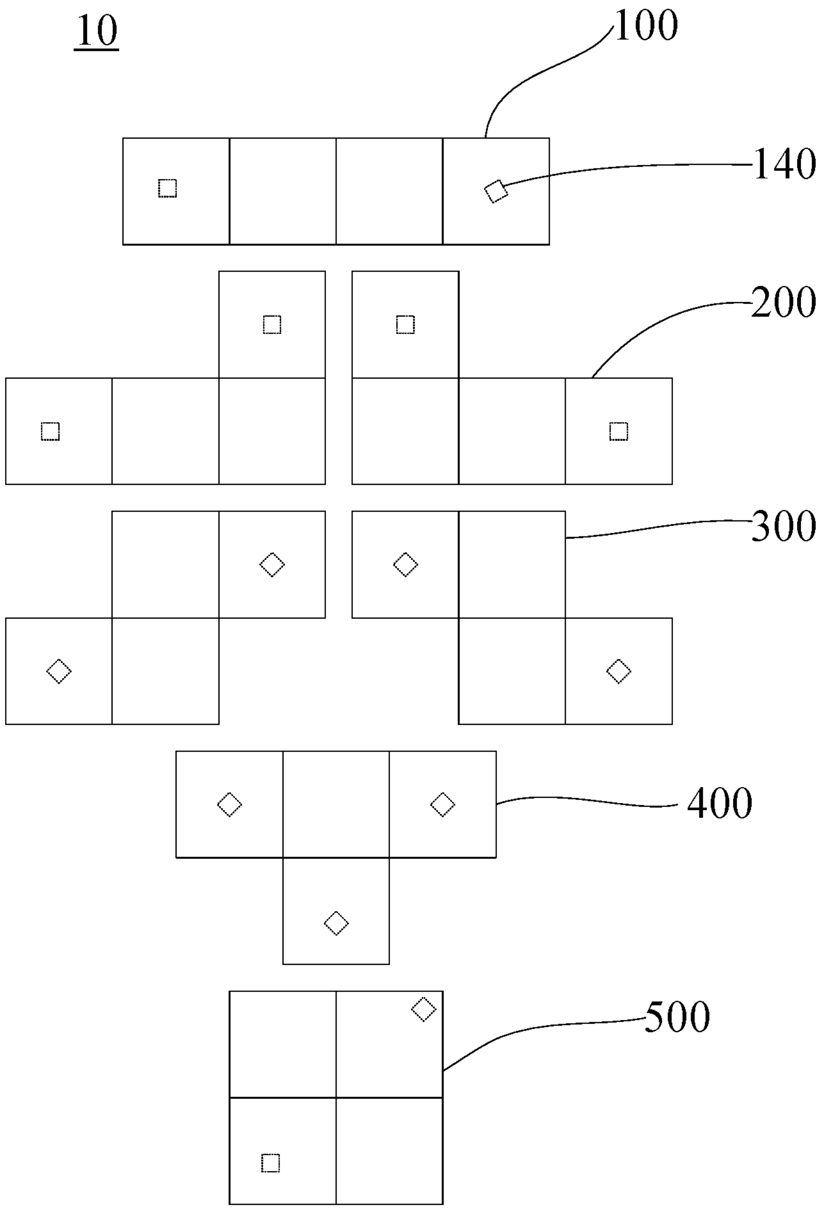
FIG. 1 is vertical view of modular lamp in implementation 1.

As shown in FIG. 1, the modular lamp 10 in implementation 1 comprises seven light-emitting modules, in which there is one "line" shape light-emitting module 100; two "L" shape light-emitting modules 200, two "Z" shape light-emitting modules 300, one "T" shape light-emitting module 400 and one "square" shape light-emitting module 500. Each light-emitting module in implementation 1 comprises four square sub-modules assembling in one plate, and the sides of adjacent sub-modules overlap to make the shapes of plurality of light-emitting module respectively correspond with that of plurality of base modules (five base modules) of standard Tetris, in which "line" shape light-emitting module 100 is main module.

The said sub-modules are only used for explaining the external shapes of each light-emitting module, but not limited to the detail composition of each light-emitting module, which means in implementation 1, the external shape of each light-emitting module can be divided into four square sub-modules, the external shape of each light-emitting module comprises four sub-modules, but each light-emitting module is as a whole.

Besides, it is understandable that in other implementations, the structural shapes of modular lamp 10 are not limited to the said above, and the structural shapes and quantity of each light-emitting module are not limited to the said above, for example, they may be in other block shapes, etc. It is understandable that in other implementations, if the modular lamp comprises a plurality of light-emitting modules, the plurality of light-emitting modules can electrically connect each other after assembling; the main module can be light-emitting module in other shape and is not limited to "line" shape light-emitting module 100.

Using "line" shape light-emitting module 100 as an example to illustrate hereinafter refers to as light-emitting module 100.

Figure 2:
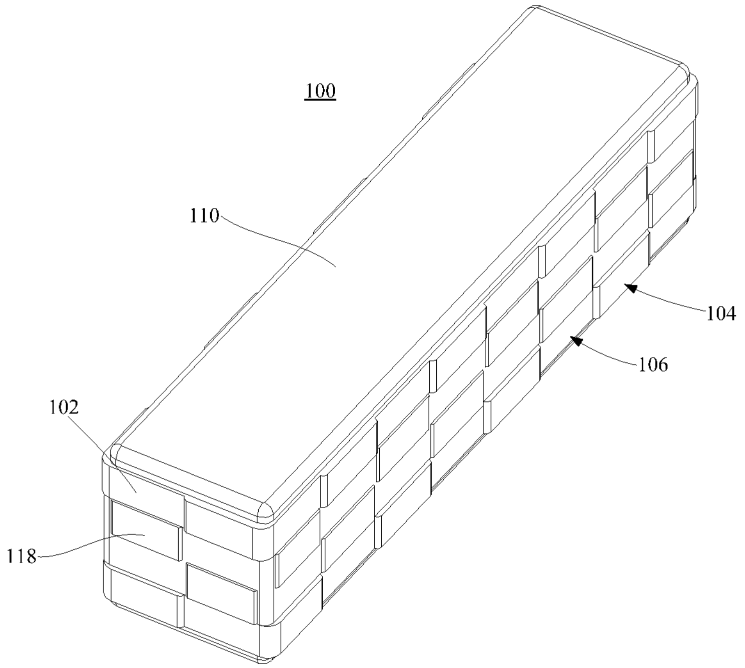
FIG. 2 is a perspective view of a modular lamp according to one embodiment of the present invention.
Figure 3:
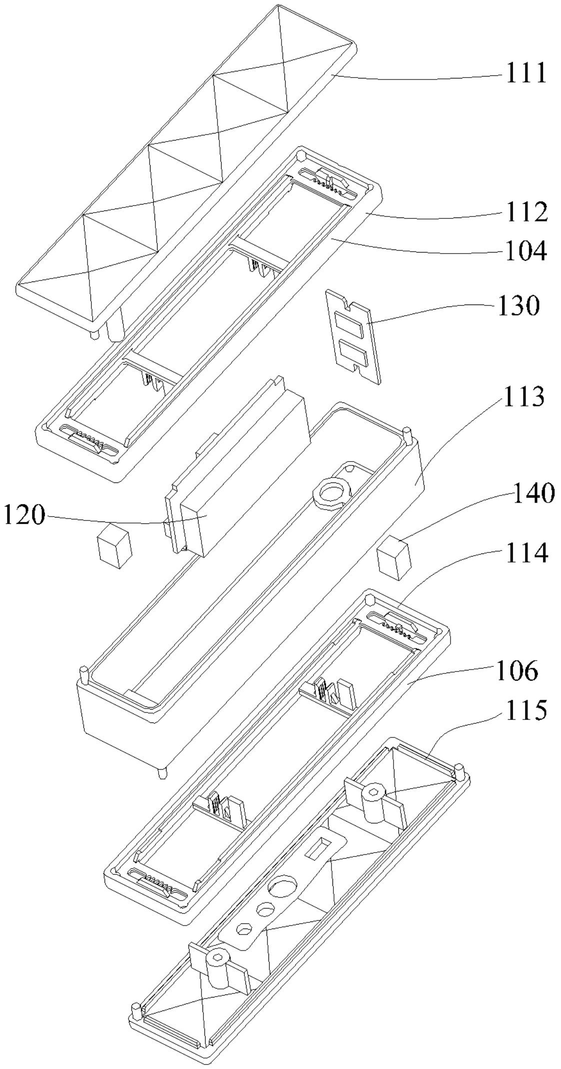
FIG. 3 is decomposition diagram of main module of FIG. 2.
Figure 4:
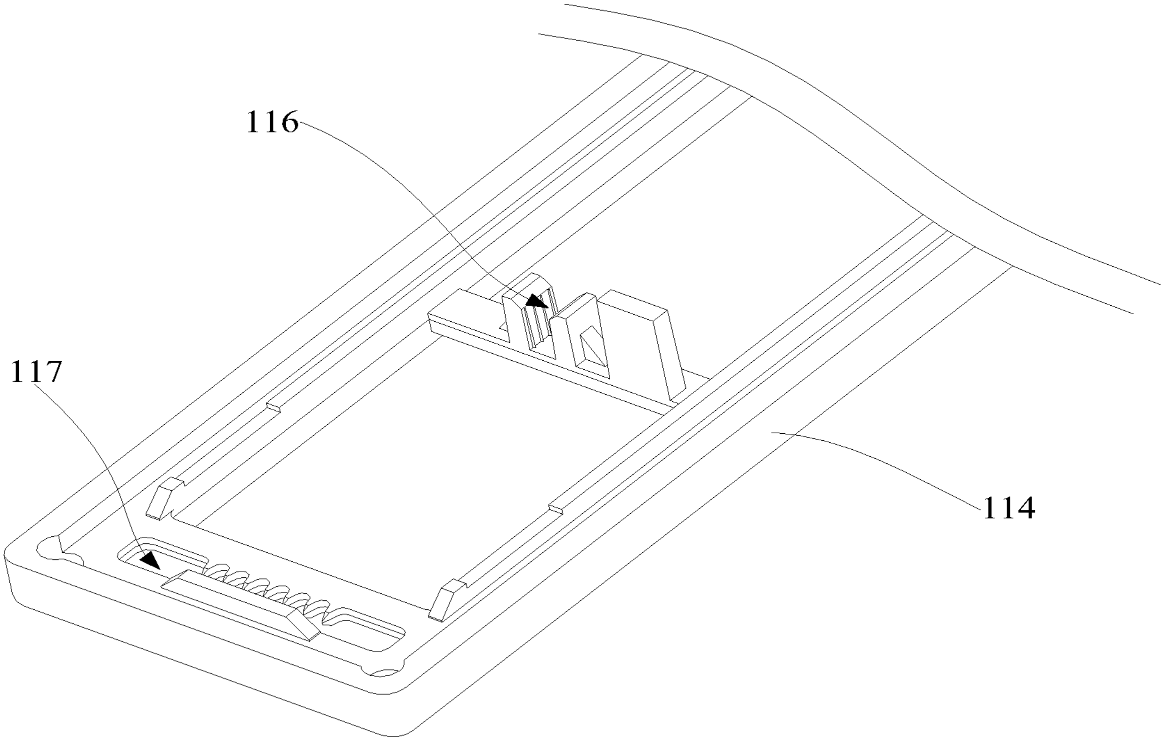
FIG. 4 is partial amplification diagram of main module of FIG. 3.

Referring the FIG. 2, FIG. 3 and FIG. 4, the light-emitting module 100 comprises housing 110, main circuit board 120, lamp plate 130 and magnetic 140. The decomposition diagram of FIG. 3 and amplification diagram of FIG. 4 do not present the corresponding conductive strips or support strips.

The housing 110 successively connects with base plate 111, the first conductive plywood 112, main frame 113, the second conductive plywood 114 and roof 115. The base plate 111, the first conductive plywood 112, main frame 113, the second conductive plywood 114 and roof 115 together make the housing 110 with holding cavity. The main circuit board 120, lamp plate 130 and magnetic 140 are set in the holding cavity of housing 110.

In details, in implementation 1, the base plate 111 and roof 115 are in rectangular plate type structure. The base 111 and roof 115 are set inward with matched erection column (which does not be indicated in the figure). The base 111 permanent connects with roof 115 through screws matched with the erection column, which makes the first conductive plywood 112, main frame 113, and the second conductive plywood 114 fixed between them. The screws can be self-tapping screws, which can be used on erection columns when install.

In implementation 1, the main frame 113 is set with clapboard, which forms magnetic field together with base plate 111 and roof 115. The magnetic field is placed with magnetic 140 the permanent magnet. The size of magnetic field is greater than that of magnetic 140, which ensure the magnetic 140 can turn over freely between base plate 111 and roof 115 and turn over magnetic pole when necessary which helps to adsorb magnetism of light-emitting module on ferromagnetic metal base plate, such as refrigerator door. The roof 115 is set with a plurality of functional mouths, such as switch mouth, charging mouth and charge lamp mouth, etc.

The outer side walls of the first conductive plywood 112 and the second conductive plywood 114 are set with conductive strips 102, the conductive strips 102 protrudes from the corresponding outer side wall, thus different light-emitting modules can electrically connect with each other through the conductive strips 102. The two sets of conductive strips 102 are set in parallel on housing 110. In implementation 1, each set of conductive strip 102 comprises a plurality of sub-conductive strips 104. The adjacent sub-conductive strips 104 of each set of conductive strip 102 are set with insulation gap 106 at interval that is the sub-conductive strips 104 of each set of conductive strip are set at interval with insulation gap 106. The length of insulation gap 106 is greater than the width of sub-conductive strip 104, and the length of sub-conductive strip 104 is not more than the distance of two sets of conductive strips 102.

Further, in implementation 1, the length of sub-conductive strip 104 and insulation gap 106 equal the half of length of side of sub-module. The two sides of corner position of the outer side walls of the first conductive plywood 112 and the second conductive plywood 114 are the sub-conductive strip 104 and insulation gap 106 respectively, and the positions of sub-conductive strip 104 and insulation gap 106 in the two sides of the corner position are set symmetrically. The position of the sub-conductive strips 104 of the two sets of conductive strips 104 is opposed to that of insulation gap 106 (that is when translate one set of conductive strip 102 to another set of conductive strip 102 and overlap them, the sub-conductive strips 102 of the two sets of conductive strips can form a continuous conductive loop around the side wall).

In other implementations, the length of sub-conductive strip 104 can be not less than length of insulation gap 106, and the length of sub-conductive strip 104 is less than the distance between two sets of conductive strips 102.

In implementation 1, the sub-conductive strip 104 protrudes from the surface of outer side wall, and correspondingly, the insulation gap 106 is placed in sunken part between two adjacent sub-conductive strips 104. It is understandable that in other implementations, when the sub-conductive strip 104 flushes with surface of outer side wall, the insulation gap 106 can be formed by the insulation materials coated between two adjacent sub-conductive strips 104.

The non-outer side wall areas (including inner wall, upper side wall and lower side wall) of the first conductive plywood 112 and the second conductive plywood 114 are set with conductive layers. The sub-conductive strip 104 on the first conductive plywood 112 electrically connects with its conductive layer, and the sub-conductive strip 104 on the second conductive plywood 114 electrically connects with its conductive layer. In implementation 1, any position in the non-outer side wall areas of the first conductive plywood 112 and the second conductive plywood 114 can be used as conductive contact, which is easy to electrically connect with other elements and to be formed. The first conductive plywood 112 and the second conductive plywood 114 are set with a plurality of windows, to hold other elements such as main circuit board 120, lamp plate 130 and magnetic 140, etc.

Further, in implementation 1, the sub-conductive strip 104 on the first conductive plywood 112 is molded in one coating structure with its conductive layer, and sub-conductive strip 104 on the second conductive plywood 114 is molded in one coating structure with its conductive layer, that is the sub-conductive strip 104 and the conductive layer can be made with same conductive materials and plated on the first conductive plywood 112 and the second conductive plywood 114, which is easy to make.

As shown in FIG. 4, in implementation 1, the first conductive plywood 112 and the second conductive plywood 114 are set with matched slots 116. The main circuit board 120 is set in slot 106 and placed between the first conductive plywood 112 and the second conductive plywood 114, and the corresponding conductive connections of two electric poles of main circuit board 120 contact with inner wall of slot 106 and form electric connection, thus the two conductive strips 102 formed by first conductive plywood 112 and the second conductive plywood 114 form two electric poles respectively. In implementation 1, the conductive connections of main circuit board 120 are metal foils.

Further, in implementation 1, the first conductive plywood 112 and the second conductive plywood 114 are set with matched limit sockets 117. At least one inner side wall of limit socket 117 is zigzag structure with certain deformability. The two ends of lamp plate 130 insert into the limit socket 117. The two electric poles of lamp plate 130 contacts with inner side wall of zigzag structure through conductive connections and form electric connection. In implementation 1, the conductive connections of lamp plate 130 are metal foils set on lamp plate 130.

The main frame 113 is rectangular frame structure. The main frame 113 is set with a plurality of registration masts, the corresponding first conductive plywood 112 and/or the second conductive plywood 114 is set with the location holes matching with the registration masts, which is easy to install.

The two sets of conductive strips of main frame 113 are set with two sets of support strips 118 protruding from the surface of main frame 113. Each set of support strip 118 comprises a plurality of sub-support strips protruding from the main frame 113, and there is support gap between adjacent sub-support strips of each set of support strip. The support gap is opposed to the position of sub-support strip, and is opposed to the position of support gap between sub-conductive strip 104 of conductive strip 102 neighboring support strips 118 and the support strip, and the position of insulation gap 106 is opposed to that of sub-support strip 106. Setting support strip 118 on main frame 113 and protruding the support strip 118 from the surface of main frame 113 will not bring stability problem causing by dislocation setting of sub-conductive strip 104 and insulation gap 106 after piling up plurality of light-emitting modules, and if the base of insulation gap 106 is set with conductive coating, it can avoid short circuit when the conductive coating contacts with sub-conductive strips of other light-emitting modules.

The main circuit board 120 is set between the first conductive plywood 112 and the second conductive plywood 114. The circuit board 120 is set with power supply, switch, charging port, charging indicator and other elements. The power supply is rechargeable power supply. In order to avoid the power supply sliding, the power supply is wrapped with double faced adhesive tape and spliced onto the inner wall of main frame 113, the stability is strong. The switch is divided into toggle switch and press switch to meet all usages. The switch can be either toggle switch or press switch.

The lamp plate 130 is set with light source. After electrically connecting the two conductive connections of lamp plate 130 with two conductive strips 102, the power path is formed and the light source shines. The LED light source is priority to be the light source, which is high in brightness, small in size and easy to assemble.

The conductive connections of main circuit board 120 and/or lamp plate 130 can be metal foils, such as copper foils or tin foils, which has small resistance and good conductive performance.

In implementation 1, the structures of main circuit board 120 and lamp plate 130 are set independently, in other implementations, the structure can be made in one or exclude main circuit board 120. When the main circuit board 120 and the lamp plate 130 are made in one structure, the main circuit board 120 and the lamp plate 130 share the conductive connections, further, the light-emitting module 110 acting as the main module may not set limit socket 117 with zigzag structure.

The first conductive plywood 112 and the second conductive plywood 114 together clamp the main circuit board 120 and form electric connection. The two ends of the lamp plate insert into the limit socket 117 of the first conductive plywood 112 and the second conductive plywood 114 respectively and contact with the inner wall of zigzag structure of limit socket 117 and form electric connection. The two electric connection methods form electric connection structure of electroplating frames such as PCB of the modular lamp 10 and conductive plywood, etc. In implementation 1, comparing with traditional design fixing electroplating frame with conductive connections of PCB through screws, the electric connection structure of PCB and conductive plywood is simpler and easy to manufacture, the performance of product is more reliable and the stability is better.

The magnetic 140 is made with square permanent magnet. It is small in size and can turn over light-emitting module 100 and reverse the direction of electric pole. In implementation 1, the light-emitting module 100 is set with two magnetic 140. The two magnetic 140 are set in the two ends of light-emitting module respectively. As for light-emitting module in other shapes, it can be set one; two, three or four magnetic 140 in corresponding light-emitting modular basing on the specific structural shapes, the imaginary lines in each light-emitting module in FIG. 1 represent magnetic 140. Setting magnetic 140 in each light-emitting module can absorb the magnetism of each light-emitting module together when assembling to avoid disposition piling or collapsing and make the modular lamp 10 in a whole.

Besides, it is understandable that in other implementations, each light-emitting module may not contain the magnetic, and each light-emitting module may get direct physical contact with each other to achieve joint.

The magnetic 140 is made with square permanent magnet. It is small in size and can turn over light-emitting module 100 and reverse the direction of electric pole. In implementation 1, the light-emitting module 100 is set with two magnetic 140. The two magnetic 140 are set in the two ends of light-emitting module respectively. As for light-emitting module in other shapes, it can be set one, two, three or four magnetic 140 in corresponding light-emitting modular basing on the specific structural shapes, the imaginary lines in each light-emitting module in FIG. 1 represent magnetic 140.

Figure 5:
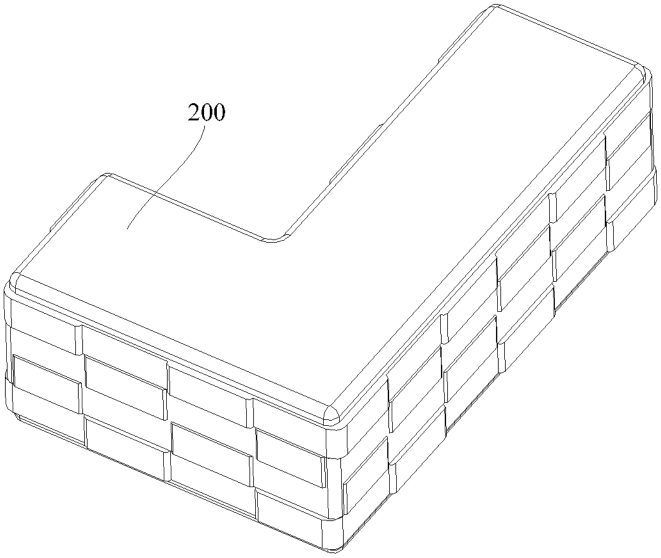
FIG. 5 is structural diagram of "L" shape light-emitting module of FIG. 1.
Figure 6:
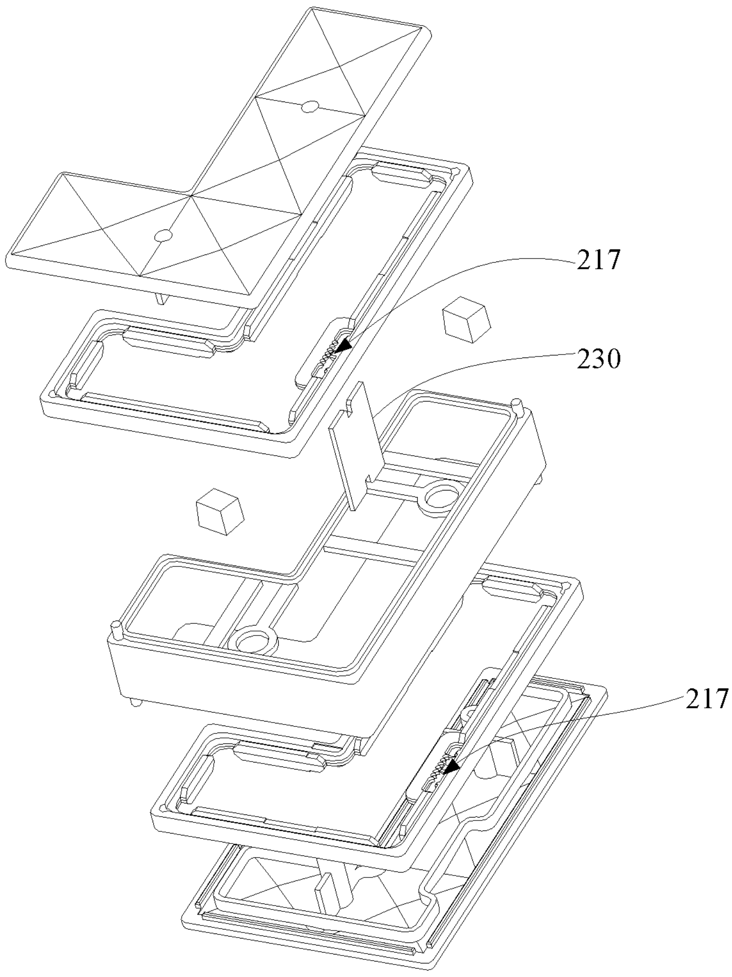
FIG. 6 is decomposition diagram of "L" shape light-emitting module of FIG. 5.
Figure 7:
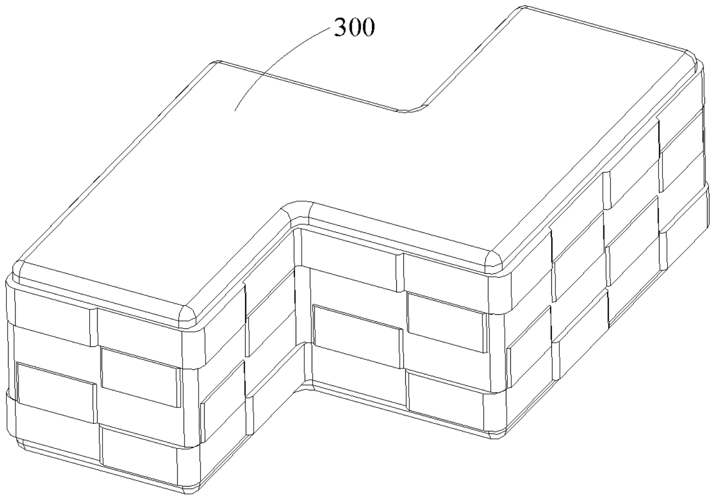
FIG. 7 is structural diagram of "Z" shape light-emitting module of FIG. 1.
Figure 8:
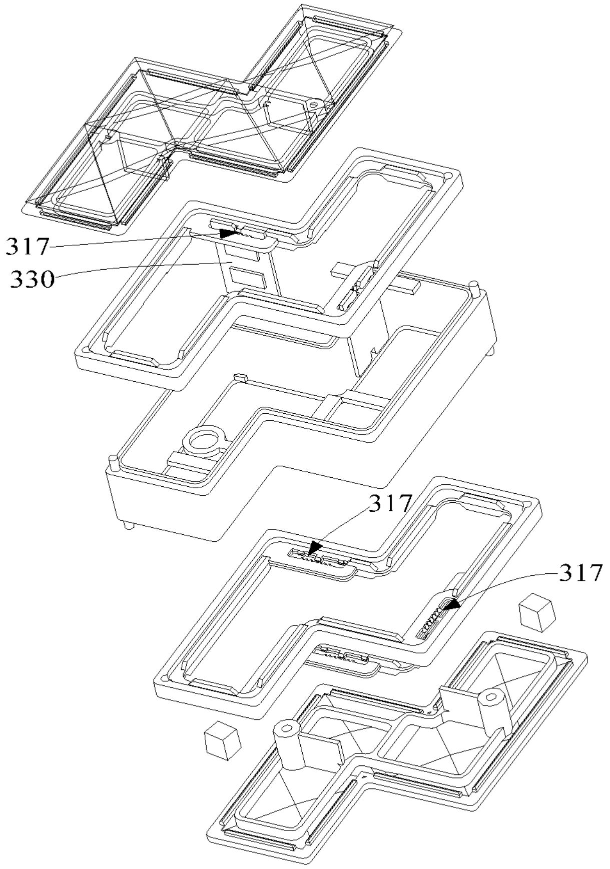
FIG. 8 is decomposition diagram of "Z" shape light-emitting module of FIG. 7.
Figure 9:
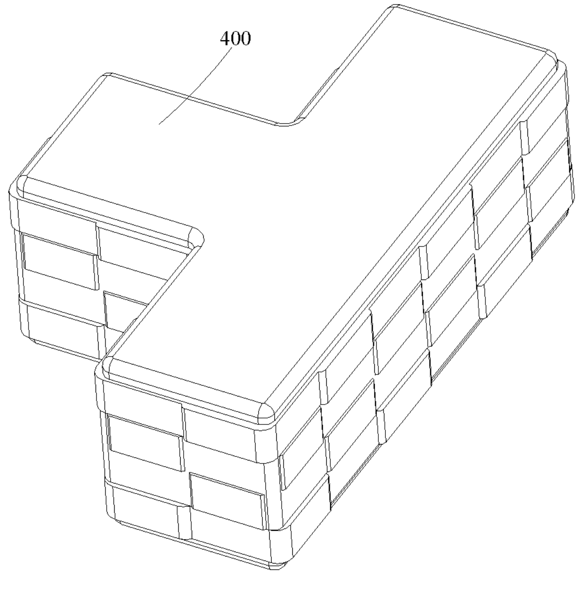
FIG. 9 is structural diagram of "T" shape light-emitting module of FIG. 1.
Figure 10:
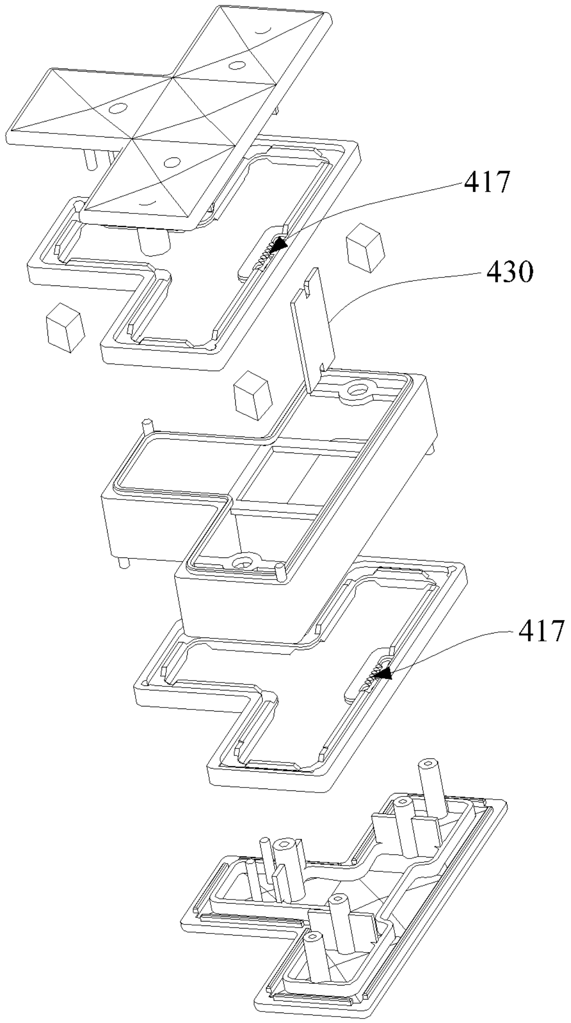
FIG. 10 is decomposition diagram of "T" shape light-emitting module of FIG. 9.
Figure 11:
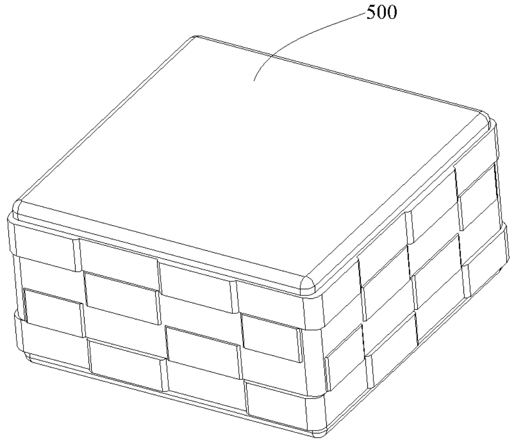
FIG. 11 is structural diagram of "square" shape light-emitting module of FIG. 1.
Figure 12:
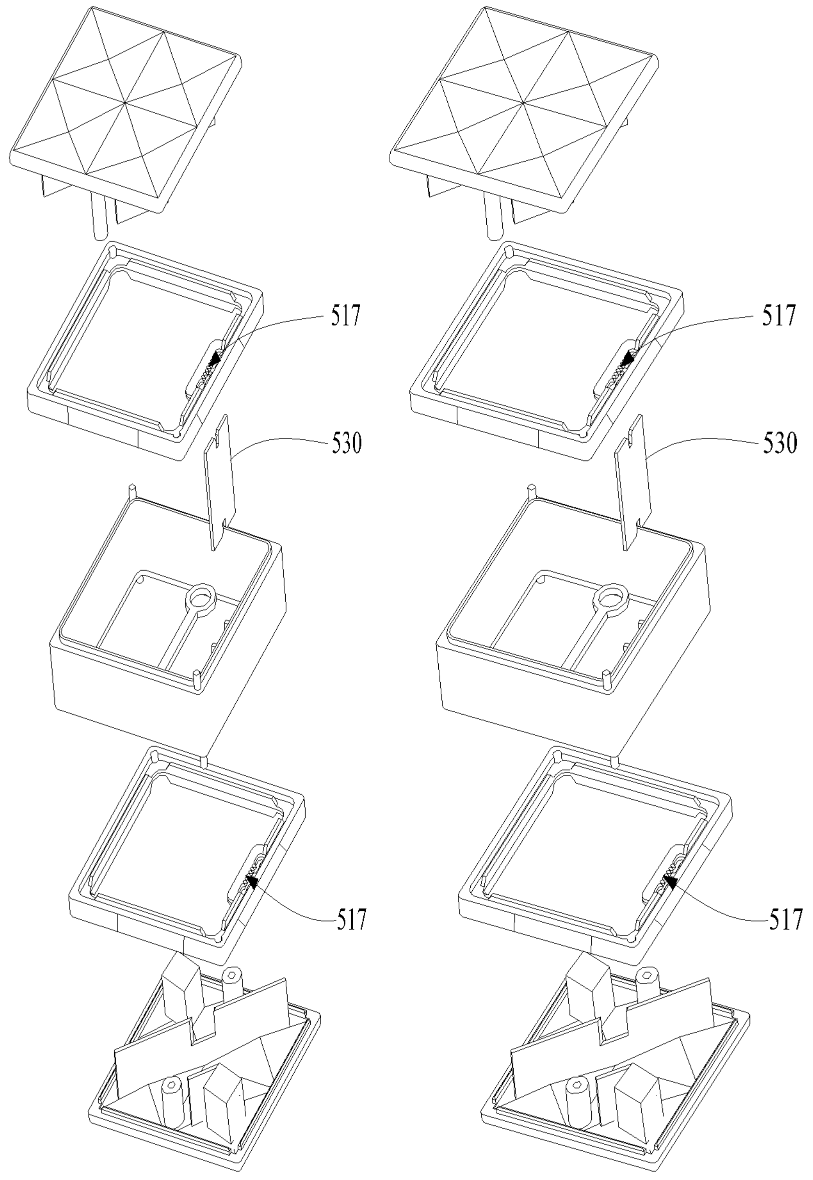
FIG. 12 is decomposition diagram of "square" shape light-emitting module of FIG. 11.

FIG. 5 and FIG. 6 are structural diagrams of “L” shape light-emitting module 200 (hereinafter refers to as light-emitting module 200) in implementation 1;

FIG. 7 and FIG. 8 are structural diagrams of “Z” shape light-emitting module 300 (hereinafter refers to as light-emitting module 300) in implementation 1;

FIG. 9 and FIG. 10 are structural diagrams of “T” shape light-emitting module 400 (hereinafter refers to as light-emitting module 400) in implementation 1;

FIG. 11 and FIG. 12 are structural diagrams of “square” shape light-emitting module 500 (hereinafter refers to as light-emitting module 500) in implementation 1;

The light-emitting module 200, 300, 400 and 500 are non-main module, the setting of conductive strip is same to that of light-emitting module 100. The shapes of light-emitting module 200, 300, 400 and 500 are different from that of main module, the non-main modules (light-emitting module 200, 300, 400 and 500) do not contain main circuit board 120, they are only set with lamp plate 230, 330, 430 and 530 respectively, correspondingly, the housings of light-emitting module 200, 300, 400 and 500 do not contain slot 116 used for fixing main circuit board 120, they are only set with corresponding limit socket 217, 317, 417 and 517 respectively. The decomposition diagrams in FIGS. 6, 8, 10 and 12 don’t present the corresponding conductive strips and support strips.

Due to the light-emitting modules 100, 200, 300, 400 and 500 are formed with four square sub-modules, each light-emitting module has 8-10 conductive connection surfaces (the exposed side surface of sub-module), after each light-emitting module overlapping, the adjacent light-emitting modules have enough electric connection surfaces to ensure the electric connection among each light-emitting module and make each light-emitting module shines or extinguishes simultaneously.

The base plate 111, main frame 113 and roof 115 of each light-emitting module can be made with plastic materials in different colors to make the modular lamp 10 form colorful lighting effect.

It is understandable that, in other implementations, the structures of modular lamp 10 are not limited to the said above, the electric connections of the conductive strip 120 and main circuit board 120 and/or lamp board 130 are not limited to the electric connection structures of PCB and conductive plywood, the conductive strip 102 electrically connects with main circuit board 120 and/or lamp board 130 through spot welding in housing 110.

Besides, it is understandable that in other implementations, the setting of each set of conductive strip in light-emitting module is not limited to the methods of light-emitting module 110, as long as each set of conductive strip contains a plurality of sub-conductive strips and there is insulation gap between adjacent sub-conductive strips of each set of conductive strip, the length of insulation gap is greater than the width of sub-conductive strip, which may achieve 3D joint and assembly among light-emitting modules. Further, in order to achieve free 3D joint, the length of sub-conductive strip can be set not less than that of insulation gap and the position of sub-conductive strips among two sets of conductive strips is opposed to that of insulation gap.

Figure 13:
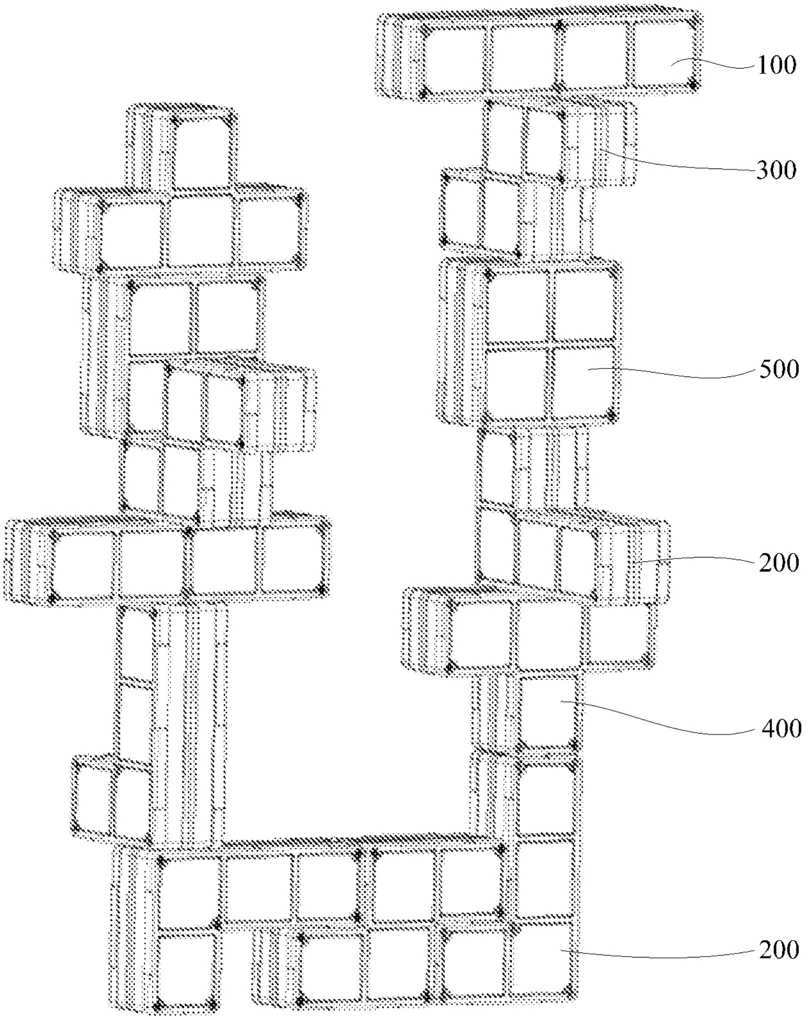
FIG. 13 is stereogram of assembled plurality of light-emitting modules in implementation 1.

As shown in FIG. 13, the modular lamp is provided with the plurality of light-emitting modules, the shapes of the light-emitting modules are flexible and variable, each module is designed independently, and after the light-emitting modules have been joined together, adjacent light-emitting modules are electrically connected via the conductive strips on the outer side walls, each set of conductive strip contains a plurality of sub-conductive strips, and there is insulation gap among the adjacent sub-conductive strips of each set of conductive strip. The length of the insulation gap is greater than the width of sub-conductive strips to ensure each light-emitting module can be jointed on the plate, make electric connection, and cross connect on specific position to attain 3D combination effect. The modular lamp may be combined to form a variety of shapes. The present invention is simple in operation, and strong in combination operability Further, setting the length of sub-conductive strips no less than that of insulation gap, setting the two conductive strips on side wall in parallel and setting the position of sub-conductive strips between the two sets of conductive strips opposed to that of insulation gap to ensure there is no short circuit, there are more assembled shapes and assembly methods when the side walls of each light-emitting module joint and assemble freely Embodiment 2

Figure 14:
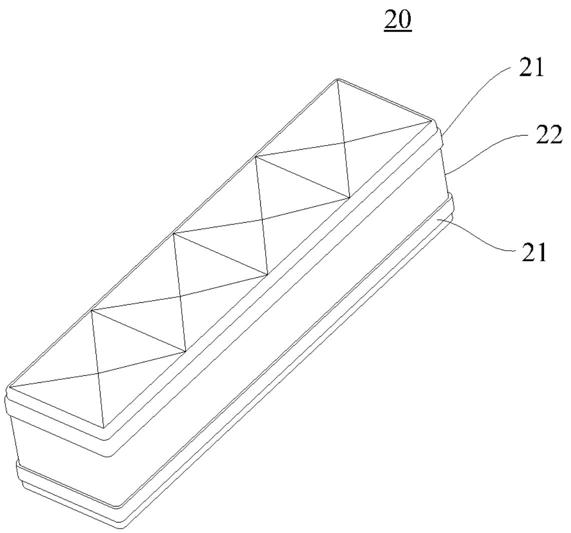
FIG. 14 is structural diagram of "line" shape main module of modular lamp in implementation 2.

In implementation 1, the conductive strips of each light-emitting module is discontinuous structure, which is set with sub-conductive strip and insulation gap at interval. As shown in FIG. 14, in implementation 2, the conductive strip 21 is continuous structure, the continuous conductive strip 21 forms conductive bands on outer side wall of the housing 22. The FIG. 14 is the structural diagram of "line" shape main module 20, except conductive strip 21, other structures is similar to that of main module in implementation 1. The inner structure of light-emitting module in other shapes is also similar to that of this implementation, unless the external conductive strip is continuous structure.

Each light-emitting module with continuous conductive strips can freely joint and assemble into different shapes or form different shapes on the same plate.

Figure 15:
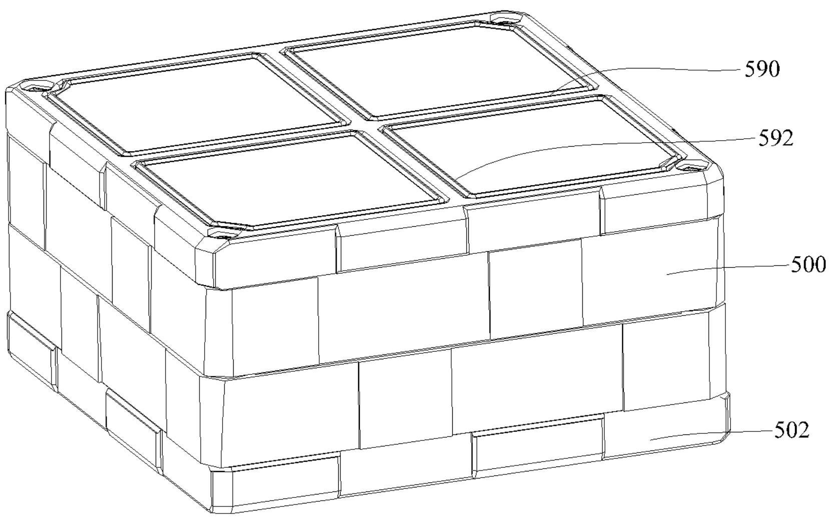
FIG. 15 is structural diagram of "square" shape light-emitting module of modular lamp in other implementations.

Besides, in other implementations, as shown in FIG. 15, the base plate and roof of "square" shape light-emitting module 500 are set with trim strip 590 in cross. The trim strip 590 is made with metal strip, and the two ends electrically connect with conductive strip 502 respectively. In order to avoid short circuit when trim strip of one light-emitting module contacts with conductive strip 502 of other light-emitting module in assembling light-emitting modules, the "square" shape light-emitting module 500 is set with anti-short circuit bone 592 along trim strip 590 and conductive strip 502 and protruding the surface of trim strip 590 (the anti-short circuit bone 592 exceeds trim strip 590 on surface of light-emitting module 500). It is understandable that, in other implementations, the trim strip 590 can be made with metallic non-conductive materials, correspondingly, it needs no anti-short circuit bone 592. Besides, it is also understandable that in other implementations, the trim strip 590 is not limited to set on base plate and roof of the "square" shape light-emitting module 500, it can be set on base plate and roof of the light-emitting module in other shapes, correspondingly, it is only need to ensure that there is no short circuit when trim strip of one light-emitting module contacts with conductive strip 502 of other light-emitting module in assembling light-emitting modules.

Figure 16:
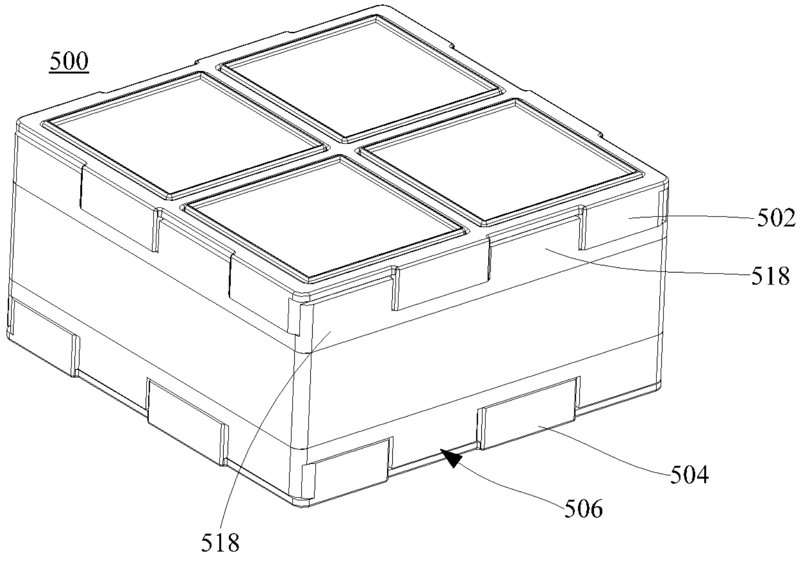
FIG. 16 is structural diagram of "square" shape light-emitting module of modular lamp in other implementations.

And, in other implementations, as shown in FIG. 16, the conductive 502 protrudes from the surface of outer side wall of "square" shape light-emitting module 500. The sub-conductive strip 504 around the outer side wall is set with anti-short circuit strip covering insulation gap 504, the sub-conductive trip protrudes from anti-short circuit strip 518. There are two sets of anti-short circuit strips 518, which are set near two conductive strips 502 respectively. In this implementation, the length of sub-conductive strip 504 is greater than that of insulation gap 506, and the length of sub-conductive trip 504 is less than the distance between the two sets of conductive strips 502, the two sets of conductive strips 502 are set in parallel on outer side wall and the position of sub-conductive strips 502 is opposed to that of insulation gap 506, the length of sub-conductive strips 504 is slightly greater than the ¼ of length of side of "square" shape light-emitting module 500 (or half of length of side of sub-module), and the length of insulation gap is slightly less than the ¼ of length of side of "square" shape light-emitting module 500 (or half of length of side of sub-module). The setting methods of anti-short circuit strip for other light-emitting module are same to the said. Setting the anti-short circuit strip avoid setting support strip and support gap on side wall and ensuring all light-emitting module stable when the light-emitting modules assemble and joint.

The support strip, anti-short circuit bone and anti-short circuit strip are made with insulating materials, which avoid short circuit when the light-emitting modules assemble and joint.

All technical features in above implementations can be combined arbitrarily. To make it clear and simple, the document doesn't provide all possible combinations of each technical feature in above implementations. But all these technical features can be included into the scope of the document only if there is no conflict.

The above implementations only present some implement methods of the invention, and the description is detail and concrete, but it cannot be treated as the limitation of scope of patent for invention. It is necessary to point out that it may take certain change and improvement for common technician in this field when it doesn't break away from the inventive concept, which belongs to the protection scope of this invention. Thus, the protection scope of this invention shall be subject to the attached patent claim.

The invention claimed is:

1. A modular lamp comprising a plurality of light-emitting modules, each light-emitting module comprising a housing and a lamp plate arranged within the housing, a light source and conductive connectors electrically connected to the light source being arranged on the lamp plate, an outer side wall of the housing being provided with two sets of conductive strips surrounding the outer side wall and protruding from the outer side wall, the two sets of conductive strips being respectively electrically connected to two electrodes of the lamp plate via the conductive connectors, wherein after the plurality of light-emitting modules have been assembled and joined together, adjacent light-emitting modules are in contact and electrically connected via the conductive strips, and wherein the light-emitting modules have shapes that are flexible and variable, and after the light-emitting modules have been joined together, adjacent light-emitting modules may be combined to form a variety of shapes; wherein each set of conductive strips contains sub-conductive strips and there is an insulation gap between adjacent sub-conductive strips of each set of the conductive strips, the length of the insulation gap is greater than the width of the sub-conductive strips, and the length of the sub-conductive strips is not more than the distance between the two sets of the conductive strips, wherein each set of the conductive strips contains some of the sub-conductive strips and the insulation gap is disposed between adjacent sub-conductive strips of each set of the conductive strips; wherein the length of the insulation gap is greater than the width of the sub-conductive strips, so that all of the light-emitting modules can electrically connect after being assembled and joined together to enable a 3-D arrangement, and wherein the length of the sub-conductive strips is not more than the distance between two sets of the conductive strips so that the light-emitting modules are not vertically limited to a 90° vertical plane in the 3-D arrangement but may be crossly placed at any angle without short circuiting.

2. The modular lamp of claim 1, wherein each set of conductive strip forms a conductive band on the outer side wall of the housing through a continuous setting.

3. The modular lamp of claim 1, wherein the length of the sub-conductive strips is not less than the length of the insulation gap, the two sets of the conductive strips are in parallel on the outer side wall, and the position of the sub-conductive strips among the two sets of the conductive strips are opposite to that of the insulation gap and wherein the length of the sub-conductive strips not less than the length of the insulation gap, the two sets of the conductive strips are in parallel on the outer side wall, and the position of the sub-conductive strips among the two sets of the conductive strips opposite to that of the insulation gap, the shapes are variable, and the combinations are flexible.

4. The modular lamp of claim 3, wherein the conductive strips protrude from the surface of the outer side wall; the sub-conductive strips surrounding the outer side wall are set with anti-short-circuiting strips covering the insulation gap, and the sub-conductive strips protrude from the anti-short-circuiting strips.

5. The modular lamp of claim 3, wherein the conductive strips protrude from the surface of outer side wall, the housing is set with two sets of support strips protruding the surface of the housing between the two sets of the conductive strips, each support strip contains several of the sub-support strips and there is a support gap between adjacent sub-support strips of each set of the support strips, the position of the support gap is opposed to that of the sub-support strips and of the support gap between the sub-conductive strips of adjacent conductive strips of the support strips and their support strips, as well as that of insulation gap and the sub-support strips; setting the support strip on the housing and making it protrude its surface will not bring stability problem causing by dislocation setting of the sub-conductive strip and the insulation gap after piling up a plurality of the light-emitting modules, and if the base of the insulation gap is set with a conductive coating, it can avoid short circuiting when the conductive coating contacts with the sub-conductive strips of other of the light-emitting modules.

6. The modular lamp of claim 1, wherein the light-emitting modules have a plurality of shapes, and each light-emitting module contains four square sub-modules in a same plane and the connecting sides of adjacent two sub-modules of light-emitting module overlap.

7. The modular lamp of claim 6, wherein the conductive strips are formed by alternate setting of a plurality of the sub-conductive strips and the insulation gap, the length of the sub-conductive strips and the insulation gap is equal to the half of the length of side of the sub-module respectively.

8. The modular lamp of claim 6, wherein the two sides of a corner position of the outer side wall of the housing are the sub-conductive strips and insulation gap respectively, and the positions of the sub-conductive strips and the insulation gap in the two sides of the corner position are set symmetrically with the corner, the position of the sub-conductive strips is opposed to that of the insulation position.

9. The modular lamp of claim 1, wherein the housing contains a base plate, first conductive layer, main frame, second conductive layer, which are successively connected to the housing, the base plate, first conductive layer, main frame, second conductive layer together make the housing with holding cavity, the outer side walls of the first conductive layer and the second conductive layer contain the conductive strips, and lamp plate is set in the holding cavity.

10. The modular lamp of claim 9, wherein the surface of non-outer side wall area of the first conductive layer and the second conductive layer is set with conducting layer, the conducting layer electrically connects with conductive connections of the lamp plate, and the conductive strips electrically connect with the conductive layer.

11. The modular lamp of claim 10, wherein the conductive strips and the corresponding conductive layer is molded in one coating structure; any position in the non-outer side wall areas can be used as conductive contact, which is easy to electrically connect with other elements and to be formed.

12. The modular lamp of claim 10, wherein the first conductive layer and the second conductive layer are equipped with matched limit sockets, and at least one inner side wall of the limit sockets is zigzag structure; and the two ends of lamp plate insert into the limit sockets, and the conductive connections of two ends of lamp plate contact with inner wall of zigzag structure to form electric connection.

13. The modular lamp of claim 12, wherein the conductive connections of two ends of lamp plate are metal foils set on the lamp plate.

14. The modular lamp of claim 13, wherein there is at least one main module in a plurality of light-emitting modules, the main module contains main circuit board, and the main circuit board contains conductive connections; the conductive connections of lamp plate corresponding electrically connect with that of main circuit board; the first conductive layer and the second conductive layer of the main module are set with matched slots; and the main circuit board is set in the slots and the conductive connections of two ends of main circuit board contact with inner wall of slots to form electric connection.

15. The modular lamp of claim 14, wherein the lamp plate of main module is molded in one with main circuit board, and the lamp plate and main circuit board share the conductive connections.

16. The modular lamp of claim 15, wherein the conductive connections of main circuit board are metal foils set on the main circuit board.

17. The modular lamp of claim 14, wherein the main circuit board comprises a switch to control the current of light source.

18. The modular lamp of claim 17, wherein the housing is set with rechargeable power supply; the rechargeable power supply electrically connects with main circuit board, and the main circuit board comprises one or more charge ports.

19. The modular lamp of claim 9, wherein the base plate is disposed inwardly of matched erection columns; the base plate permanently connects with the roof through matched screws of the erection columns and makes the first conductive layer, the main frame and the second conductive layer are disposed centrally.

20. The modular lamp of claim 9, wherein the base plate and the main frame cause a magnetic field, and the plurality of light-emitting modules can be assembled and joined to each other through magnetic adsorption of a magnet.

21. The modular lamp of claim 20, wherein the magnetic strength of the magnet is less than that of the magnetic field to ensure that the magnet turns over freely in the magnetic field; and the magnet may turn over freely in the magnetic field to change poles when necessary.

22. The modular lamp of claim 1, wherein the base plate comprises trim strips, and the two ends of the trim strips connect with the conductive strips.

23. The modular lamp of claim 22, wherein the trim strips are metal strips, the base plate is arranged to avoid short circuiting when one trim strip of the light-emitting module connects with the conductive strip of another light-emitting module.

24. An electric connection structure for a PCB and an electroplating frame, wherein the PCB is set with first conductive connections electrically connecting with electrical elements; the outer side walls of the electroplating frame are set with first conductive strips; the surface of a non-outer side wall area of the electroplating frame is set with a first conductive layer; the first conductive layer electrically connects with the first conductive connections, and the first conductive strips electrically connect with a second conductive layer; the outer side walls of the electroplating frame are set with second conductive strips, the non-outer side wall area is set with a third conductive layer, and the third conductive layer electrically connects with second conductive connections of third conductive strips and the PCB respectively.

25. The electric connection structure of claim 24, wherein the conductive strips and the corresponding conductive layer are molded in one coating structure.

26. The electric connection structure of claim 24, wherein the electroplating frame is equipped with limit sockets, and at least one inner side wall of the limit sockets is zigzag structure; the PCB inserts into the limit sockets, and the conductive connections of the PCB contact with an inner wall of a zigzag structure to form an electric connection.

27. The electric connection structure of claim 26, wherein the electroplating frame conductive slots and the PCB is set in the slots and the conductive connections of the PCB contact with an inner wall of the slots to form an electric connection.

28. The electric connection structure of claim 27, wherein the conductive connections are metal foils on the PCB.

29. A modular lamp comprising a plurality of light-emitting modules, each light-emitting module comprising the electric connection of claim 24, in which the PCB comprises a lamp plate set with a light source; the electroplating frame comprises the first conductive layer and the second conductive layer, the light-emitting module comprises base plate, main frame and roof; the base plate, first conductive layer, main frame, second conductive layer and strip are set successively and together make the housing with a holding cavity, the outer side walls of the first conductive layer and the second conductive plywood layer contain the conductive strips, and lamp plate is set in the holding cavity; wherein after a plurality of light-emitting modules are assembled and joined, the adjacent light-emitting modules can electrically connect with each other through the conductive strips.

* * * * *